United States Patent [19]
Oyama et al.

[11] Patent Number: 5,459,124
[45] Date of Patent: Oct. 17, 1995

[54] PROCESS FOR PRODUCING OXIDE SUPERCONDUCTOR

[75] Inventors: Terutsugu Oyama; Masato Murakami; Naoki Koshizuka; Shoji Tanaka, all of Tokyo, Japan

[73] Assignees: International Superconductivity Technology Center, Tokyo; Shinkoku Electric Power Co., Inc., Kagawa; Nippon Steel Corporation, Tokyo, all of Japan

[21] Appl. No.: 144,947

[22] Filed: Oct. 29, 1993

Related U.S. Application Data

[63] Continuation of Ser. No. 946,458, Nov. 13, 1992, abandoned.

[30] Foreign Application Priority Data

Mar. 14, 1991 [JP] Japan .................................. 3-49778

[51] Int. Cl.$^6$ ........................... C04B 35/505; C04B 35/45
[52] U.S. Cl. ........................... 505/450; 505/430; 505/725
[58] Field of Search ................. 505/1, 725, 741, 505/785, 450, 430; 264/332

[56] References Cited

U.S. PATENT DOCUMENTS

| | | | |
|---|---|---|---|
| 4,956,338 | 9/1990 | Rapp | 505/737 |
| 5,057,487 | 10/1991 | Parker | 505/729 |
| 5,089,468 | 2/1992 | Yoshida | 505/1 |
| 5,151,407 | 9/1992 | Provenzano | 505/1 |

FOREIGN PATENT DOCUMENTS

| | | |
|---|---|---|
| 63-170275 | 7/1988 | Japan . |
| 64-87576 | 3/1989 | Japan . |

OTHER PUBLICATIONS

Database WPI, Derwent Publications Ltd. London, Week 9122 AN 91-161045 Apr. 23, 1991.
Database WPI, Derwent Publications Ltd., London, Week 9144 AN 91-321516 Sep. 20, 1991.
Patent Abstracts of Japan vol. 15 No. 488 for JP 3215342.
Patent Abstracts of Japan, vol. 17, No. 257, for JP 5002933 Aug. 1, 1993.
Richardson, "Aluminium Cladding of High Temperature Superconductor..." *Appl. Phys. Lett.*, 52(23), Dec. 5, 1988, pp. 2342–2343.
Tien, "Hot Isostatic Pressing (HIP) For The Densification ..." *MRS: High Temp. Superconductors II*, Apr., 1988, pp. 73–76.

*Primary Examiner*—C. M. Bonner
*Attorney, Agent, or Firm*—Kenyon & Kenyon

[57] ABSTRACT

A process for producing an oxide superconductor, comprising putting a formed body of raw material powders for forming an oxide superconductor on silver or silver oxide within a pan which does not melt at the melting point of silver, heating the pan to a temperature higher than the melting point of silver to bring the formed body to a semi-molten state with the formed body being floated on molten silver, cooling the pan and taking the formed body out of the re-solidified silver. This process enables a large bulk material having a diameter of 10 cm or more to be produced without occurrence of cracking.

4 Claims, 1 Drawing Sheet

1

PROCESS FOR PRODUCING OXIDE SUPERCONDUCTOR

This is a continuation of application Ser. No. 07/946,458 filed on Nov. 13, 1992, now abandoned.

TECHNICAL FILED

The present invention relates to a process for producing an oxide superconductor, and particularly to a process for producing an oxide superconductor in a large bulk form having a high critical current density.

BACKGROUND ART

The discovery of oxide superconductors, such as RE—Ba—Cu—O-based (wherein RE represents a rare earth element) superconductors, has enabled liquid nitrogen to be used as a cooling medium, so that application of the superconductor which was considered difficult to realize has been moved into the limelight. Typically, it has become possible for a superconducting material to be used in a bulk form without being formed into a wire rod. For example, magnetic levitation becomes possible through the utilization of repulsion against a magnet, which has led to studies on the application of the superconducting material to a bearing and a flywheel. Since the oxide superconductor is inherently a brittle material, it is difficult to produce a very long wire rod therefrom due to its brittle property. However, if it is moldable into a bulk form, the practical use of the oxide superconductor is highly promising. Namely, if a large bulk material can be formed, for example, this would enable the oxide superconductor to be applied to a ring magnet having a large bore diameter, or a magnetic shield.

The melt process represented by the MPMG (melt powdering melt growth) process (see U.S. patent application Ser. No. 08/073,656 which is a continuation of Ser. No. 07/606,207 (now abandoned)) which has been developed by the present inventors in recent years has enabled a large bulk material to be produced from a RE—Ba—CuO-based superconducting material (wherein RE represents a rare earth element including Y) while maintaining a high critical current density. The MPMG process comprises heat-melting a mixed powder comprising $RE_2O_3$, $BaCO_3$ and $CuO$ in a temperature range of from 1300° to 1450° C., cooling the melt to give a solidified product, pulverizing the solidified product, forming the resultant powder into a predetermined shape, heating a formed body to a partially-melted state (a mixed state comprising $RE_2BaCuO_5$ (211 phase) and a liquid phase) at a temperature of 1050° to 1200° C. and cooling the partially-melted formed body according to a predetermined temperature pattern to give a RE—Ba—CuO-based oxide superconductor. This enables a bulk material having a diameter of 3 cm and a height of about 2 cm to be prepared with a high reproducibility. This has led to success in levitating person through the use of such a bulk material.

When further development in the future is taken into consideration, it becomes necessary to produce a larger bulk material. Specifically, in the melt process, since the raw materials which have been melted and solidified are pulverized and then formed, in principle, any large bulk material can be produced. In an actual attempt to produce a bulk material having a diameter of 15 cm and a height of 2 cm, however, the occurrence of cracking was observed. This makes it difficult to produce a further increase in the size of the bulk material and gives rise to a problem of deterioration of properties.

It has been found that the occurrence of cracking is attributable mainly to the deformation of the formed body by dead weight during the heat treatment in a partially-molten state at 1050° to 1200° C. and the reaction and adhesion of the formed body to a substrate ($Al_2O_3$, Pt or other plate) supporting the formed body which leads to the occurrence of strain in the formed body different from the coefficient of thermal expansion of the substrate in the step of cooling. In order to attain a high critical current density, it is required to conduct a heat treatment in a partially-molten state. In this case, the heat treatment should be conducted while preventing the occurrence of as much strain as possible.

In view of the above-described circumstances, an object of the present invention is to provide a process for producing an oxide superconductor which enables a large formed body of an oxide superconductor to be produced without occurrence of cracking through the elimination of as much strain as possible in the treatment of the oxide superconductor in a partially-molten state at 1050° to 1200° C.

CONSTITUTION OF THE INVENTION

In order to attain the above-described object, the present invention provides a process for producing an oxide superconductor, comprising heat-treating a formed body of raw material powders to form an oxide superconductor at a temperature higher than the melting point of a silver plate on which said formed body is put and levitating the formed body on molten silver.

In the present invention, molten silver is used as the medium for floating the formed body. However, no problems occur when the molten silver is replaced with a substance having a comparable effect.

BEST MODE FOR CARRYING OUT THE INVENTION

The best mode for carrying out the present invention will now be described in more detail.

In the present invention, at the outset, a formed body of raw material powders for forming an oxide superconductor is prepared.

This formed body can be produced, for example, by a method described in U.S. patent application Ser. No. 08/073,656 which comprises heating a mixed powder comprising $RE_2O_3$, $BaCO_3$ and $CuO$ in a predetermined mixing ratio to a temperature of 1200° C. or above, cooling the melt to room temperature to give a solidified product, pulverizing the solidified product and forming the solidified product. The rare earth element of $Re_2O_3$ may be at least one of Y, Sm, Eu, Gd, Dy, Ho, Er, Tm, Yb, and Lu.

The formed body can be produced by subjecting a powder to single screw press forming.

Figure 1:
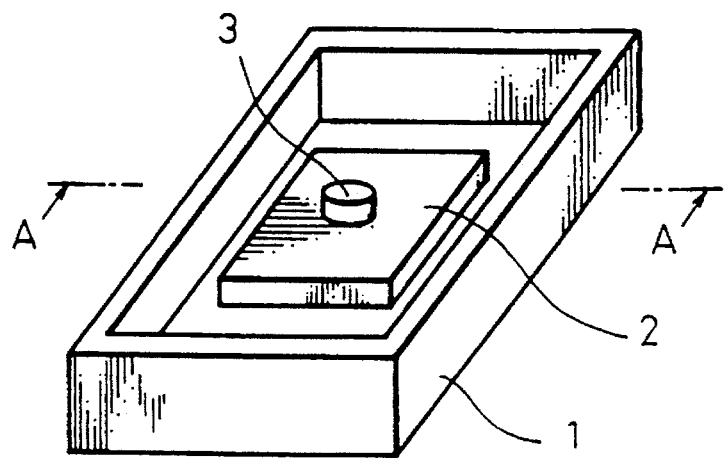
FIG. 1 is a perspective view showing the outline of the present invention.
Figure 2:
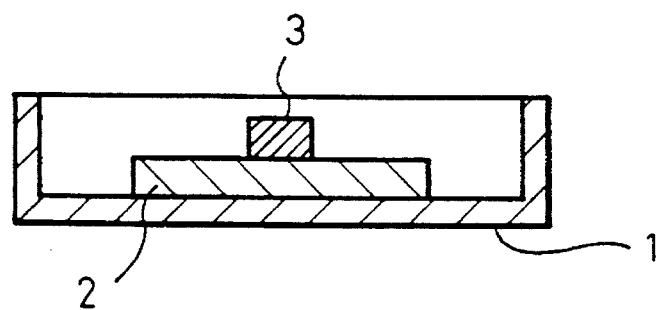
FIG. 2 is a sectional view taken on line A—A of FIG. 1.

Then, the formed body is heat-treated to bring the formed body to a semi-molten state. Specifically, as shown in FIGS. 1 and 2, a supporting substrate (pan) 1, for example, $Al_2O_3$, Pt or Ni, which does not dissolve at 1200° C. is placed within a heating furnace. A plate 2 of silver or silver oxide is placed in the pan 1, and the formed body 3 is put on the plate 2. The pan is heated to bring the formed body to a partially-molten state (state of mixing of a 211 phase with a liquid phase). The heating is conducted at a temperature higher than the melting point of silver, that is, 960° C. The heating temperature should be at least a temperature at which the formed body is brought to a partially-molten state, that is, in the range of from 1050° to 1200° C.

Figure 3:
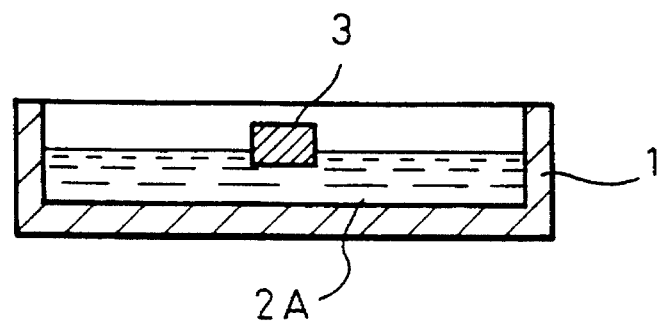
FIG. 3 is a diagram showing a state in which a silver plate shown in FIG. 2 is melted.

When the pan 1 is heated within the heating oven to 960° C., the silver plate or silver oxide plate (which is decomposed into silver) is melted and becomes a liquid state 2A as shown in FIG. 3. Since the formed body 3, that is, the oxide superconductor, has a smaller specific gravity than that of silver, it remains floating on the molten silver.

When the temperature reaches 1050° to 1200° C., the formed body 3 enters a partially-molten state with the molding 3 being floated on the molten silver 2A.

Then, the pan 1 is gradually cooled within the heating oven (at a cooling rate of 0.2° to 20° C./sec). In this case, the molten silver becomes solid in such a state that it is interposed between the formed body and the pan. Since it does not react with the formed body, the heat-treated formed body can be taken out of the silver plate.

According to this process, when the formed body is heat-treated to a partially-molten state, since the formed body is heated with the formed body being floated on molten silver, substantially no strain is applied to the formed body and, at the same time, the soaking property can be enhanced.

Further, since the formed body does not react with silver, cracking derived from the adhesion between the formed body and the pan in the solid phase region does not occur. Further, when silver is used as a pedestal, it can be allowed to serve as a thermal or magnetic stabilizing material in the stage of application of the oxide superconductor, which enables a pedestal for a fly wheel to be directly prepared.

Thus, the present invention has made it possible to produce a bulk material having a diameter of 10 cm or more which has hitherto been considered difficult to produce without occurrence of cracking.

EXAMPLES

Example 1

Powders of $Y_2O_3$, $BaCO_3$ and $CuO$ were mixed with each other so that the molar ratio of Y:Ba:Cu was 1.8:2.4:3.4, and the mixture was calcined at 920° C. for 24 hr, melted at 1400° C. for 20 min and then cooled to give a solidified product. The solidified product was pulverized to prepare a powder having a size of about 10 μm which was then formed by means of a single screw press forming machine (30 kg/cm$^2$) into two disks having a diameter of about 15 cm and a height of 2 cm. One disk was put on a Pt plate, and the other disk was put on a container wherein a silver plate 2 was placed on a Ni metal pan 1 as shown in FIGS. 1 and 2. The container was heated at 1100° C. for 20 min, cooled to 1000° C. over a period of one hour, cooled to 900° C. at a rate of 1° C./hr and then cooled in the furnace.

In the sample on the Pt plate, a number of cracks occurred on the surface. On the other hand, in the sample prepared on silver, cracking did not occur. The magnetic repulsion was measured at a place 1 mm above the oxide superconductor cooled with liquid nitrogen through the use of a magnet having a diameter of 3 cm and a surface magnetic field of 4000 Gauss and found to be 3 kg for the cracked sample and 20 kg for the sample subjected to a treatment on silver.

Example 2

A powder produced by pulverizing the solidified product prepared in Example 1 was packed into a silver pipe having a length of 10 cm, an inner diameter of 1 cm and an outer diameter of 2 cm and subjected to compression forming. The formed body was put on a Ni metal pan, heated at 1100° C. for 20 min, cooled to 1000° C. over a period of one hour, cooled to 900° C. at a rate of 1° C./hr and then cooled in a furnace. Thereafter, only the formed body was taken out of the silver and heat-treated in oxygen at 300° C. for 100 hr. As a result, a round bar having a length of 10 cm and a diameter of 0.8 cm could be prepared.

This sample exhibited a critical current density of 10000 A/cm$^2$ at 77 k zero magnetic field.

Example 3

10 pellets having a diameter of 3 cm and a height of 2 cm were prepared by means of a single screw press forming machine (30 kg/cm$^2$) through the use of a powder produced by pulverizing the solidified product prepared in Example 1, and put on a silver plate in a Ni metal pan. Thereafter, the silver plate was heated at 1100° C. for 20 min and cooled to 1000° C. over a period of one hour, gradually cooled to 900° C. at a rate of 1° C./hr, and then cooled in a furnace. Molten silver was further poured from the top without separating the resultant composite comprising silver and an oxide superconductor to give a plate wherein the surface of the oxide superconductor was exposed. The whole system was heat-treated at 300° C. for 100 hr in oxygen. The plate was cooled at liquid nitrogen temperature. When the plate was cooled at a liquid nitrogen temperature and placed on a circular magnet, it could be freely rotated. This shows that the superconductor can function as a bearing and a fly wheel.

Example 4

A disk was prepared in the same manner as that of Example 1, except that $HO_2O_3$, $Dy_2O_3$, $Sm_2O_3$, $Yb_2O_3$ and $Eu_2O_3$ were used instead of $Y_2O_3$. The magnetic repulsion was measured on a material treated on silver subjected to partially-molten heating through the use of silver (a material according to the present invention) and a material subjected to an ordinary treatment wherein no use was made of silver in the same manner as that of Example 1. The results are given in Table 1. As is apparent from Table 1, all of the materials of the present invention exhibited a significant effect.

TABLE 1

| Evaluation of Levitation Force Property of Disk Prepared by Heat Treatment on Silver | | |
|---|---|---|
| | Levitation force (kg–G) | |
| $RE_2O_3$ used | material subjected to ordinary heat treatment | material subjected to heat treatment on silver |
| Ho | 2 | 21 |
| Dy | 1.6 | 18 |
| Sm | 1.8 | 19 |
| Yb | 0.8 | 15 |
| Eu | 2 | 20 |

Example 5

$Y_2O_3$, $BaCO_3$ and CuO were mixed with each other so that the ratio of Y:Ba:Cu was 1.6:2.3:3.5, and the mixture was calcined at 900° C. for 24 hr in the air. After pulverization, the powder was formed into a disk having a diameter of 15 cm and a height of 2 cm. The disk was put on a container wherein a silver plate was placed on a stainless steel metal pan. The container was heated at 1050° C. for 30 min, cooled to 1000° C. over a period of 30 min, cooled to 850° C. at a rate of 1° C./hr and then cooled in the furnace.

As a result, a sample free from cracking was prepared. The repulsion of the sample immersed in liquid nitrogen was measured through the use of a magnet having a diameter of 3 cm and a surface magnetic field of 4000 G, and found to be 10 kg at a point 1 mm above the sample.

INDUSTRIAL APPLICABILITY

As is apparent from the foregoing detailed description, according to the present invention, it has become possible to produce a large oxide superconductor bulk material having a diameter of 10 cm or more which has been considered difficult to produce without occurrence of cracking, which enables the present invention to be applied to a magnetic shield, or a ring magnet having a large bore diameter. This renders the utilization and the range of application of the present invention expandable.

We claim:

1. A process for producing and RE—Ba—CuO-based superconductor comprising:

putting a body formed from heat treated mixed powders, said mixed powders being material which forms a RE—Ba—CuO-based superconductor, on silver or silver oxide within a pan which does not melt at the melting point of silver;

heating the pan to a temperature of 1050°–1200° C. to melt the silver and to bring the formed body to a semi-molten state with the formed body floating on the molten silver;

cooling the pan and removing the formed body from resolidified silver.

2. A process according to claim 1, wherein said oxide superconductor is an oxide comprising at least one element selected from the group consisting of Y, Sm, Eu, Gd, Dy, HO, Er, Tm, Yb and Lu (hereinafter referred to as "RE"), Ba and Cu.

3. A process according to claim 1, wherein said formed body of heat treated mixed powders is formed by mixing $RE_2O_3$, $BaCO_3$ and CuO to give a mixed powder, heating the mixed powder to 1200° C. or above, cooling to give a solidified product, pulverizing the solidified product and forming the resultant powder.

4. A process for producing an RE—Ba—CuO-based superconductor comprising:

packing heat treated mixed powders which form an RE—Ba—CuO-based superconductor into a silver or silver oxide pipe;

compressing said powders to form a compression formed body;

putting the silver or silver oxide pipe containing the compression formed body on a pan which does not melt at the melting point of silver;

heating the pan to a temperature of 1050° to 1200° C. to melt the silver and bring the compression formed body to a semi-molten state with the compression formed body floating on the molten silver;

cooling the pan and removing the compression formed body from re-solidified silver.

* * * * *

UNITED STATES PATENT AND TRADEMARK OFFICE
CERTIFICATE OF CORRECTION

PATENT NO.  : 5,459,124
DATED       : October 17, 1995
INVENTOR(S) : Terutsugu OYAMA, et al.

It is certified that error appears in the above-indentified patent and that said Letters Patent is hereby corrected as shown below:

Column 2, line 61, change "$Re_2O_3$" to --$RE_2O_3$--.

Column 6, line 10, change "HO," to --Ho,--.

Signed and Sealed this

Sixteenth Day of April, 1996

Attest:

BRUCE LEHMAN

Attesting Officer

Commissioner of Patents and Trademarks